United States Patent
Gan et al.

(10) Patent No.: US 8,816,501 B2
(45) Date of Patent: Aug. 26, 2014

(54) IC DEVICE INCLUDING PACKAGE STRUCTURE AND METHOD OF FORMING THE SAME

(71) Applicants: Zhenghao Gan, Shanghai (CN); Fang Chen, Shanghai (CN)

(72) Inventors: Zhenghao Gan, Shanghai (CN); Fang Chen, Shanghai (CN)

(73) Assignee: Semiconductor Manufacturing International Corp, Shanghai (CN)

( * ) Notice: Subject to any disclaimer, the term of this patent is extended or adjusted under 35 U.S.C. 154(b) by 58 days.

(21) Appl. No.: 13/684,165

(22) Filed: Nov. 22, 2012

(65) Prior Publication Data

US 2014/0015136 A1 Jan. 16, 2014

(30) Foreign Application Priority Data

Jul. 12, 2012 (CN) .......................... 2012 1 0241511

(51) Int. Cl.
*H01L 23/48* (2006.01)
*H01L 25/065* (2006.01)
*H01L 23/52* (2006.01)
*H01L 21/768* (2006.01)

(52) U.S. Cl.
CPC ............ *H01L 23/52* (2013.01); *H01L 25/0657* (2013.01); *H01L 2924/0002* (2013.01); *H01L 21/76829* (2013.01); *H01L 23/481* (2013.01)

USPC .................... 257/751; 257/774; 257/E23.067

(58) Field of Classification Search
CPC . H01L 23/52; H01L 21/76829; H01L 23/481; H01L 25/0657; H01L 2924/002; H01L 2924/00
USPC .......... 257/751, 621, 774, E21.577, E21.578, 257/E23.011, E23.067, E23.145, E23.174; 438/627
See application file for complete search history.

(56) References Cited

U.S. PATENT DOCUMENTS

| | | | |
|---|---|---|---|
| 4,884,123 A * | 11/1989 | Dixit et al. ..................... | 257/751 |
| 6,642,081 B1 * | 11/2003 | Patti .............................. | 438/109 |
| 7,071,510 B2 * | 7/2006 | Lee ................................. | 257/303 |
| 7,759,700 B2 * | 7/2010 | Ueno et al. .................... | 257/192 |
| 2011/0034027 A1 | 2/2011 | Kuo et al. | |
| 2012/0038049 A1 * | 2/2012 | Trautmann et al. ........... | 257/751 |

* cited by examiner

Primary Examiner — Cuong Q Nguyen
Assistant Examiner — Yosef Gebreyesus
(74) Attorney, Agent, or Firm — Anova Law Group, PLLC

(57) ABSTRACT

Various embodiments provide semiconductor devices including a package structure and methods of forming the semiconductor devices. In one embodiment, the package structure can include a through-hole at least partially filled by one or more layers of material(s) to form a through-hole interconnect between semiconductor devices in the package structure. The through-hole can be filled by an insulating layer, a diffusion barrier layer, a metal interconnect layer, and/or a protective layer having a total thickness from the sidewall of the through-hole of less than or equal to the radius of the through-hole.

20 Claims, 7 Drawing Sheets

IC DEVICE INCLUDING PACKAGE STRUCTURE AND METHOD OF FORMING THE SAME

CROSS-REFERENCES TO RELATED APPLICATIONS

This application claims priority to Chinese Patent Application No. CN201210241511.3, filed on Jul. 12, 2012, the entire contents of which are incorporated herein by reference.

FIELD OF THE DISCLOSURE

The present disclosure relates to the field of semiconductor technology and, more particularly, relates to an IC device including a package structure and method of forming the same.

BACKGROUND

With development of semiconductor technology, the feature size of semiconductor devices in integrated circuit (IC) devices has been reduced. Also, it has become increasingly difficult to increase the number of semiconductor devices in a two-dimensional (2D) package structure. Three-dimensional (3D) packaging becomes an effective tool to improve integration degree of IC devices or chips. The 3D packaging methods may include die stacking and package stacking based on gold wire bonding, and 3D stacking based on through-silicon vias (TSVs). The TSV-based 3D stacking technology may provide advantages including (1) high-density integration; (2) significantly-shortened-length of electrical interconnect, which solves signal delays and other problems occurring in a 2D system-on-chips (SOCs); and (3) integration of chips with different functions (e.g., RF, memory, logic, MEMS, etc.) to achieve versatility of the packaged devices.

Existing methods of forming a through-silicon via (TSV) include: forming a through-hole at a first surface of the silicon substrate by dry etching; forming an insulating layer on the sidewall and bottom surfaces of the through-hole; filling the through-hole with copper by an electroplating process; removing excess copper by a chemical mechanical polishing (CMP) process; polishing a second surface of the silicon substrate opposite to the first surface until the filled copper is exposed to form the TSV. The formed TSV can electrically connect a semiconductor device in the silicon substrate to another semiconductor device in another silicon substrate.

Currently, the insulating layer is typically made of silicon oxide and the silicon substrate is made of silicon. When forming the TSV by copper, a high temperature is usually used. Under this high temperature, due to different thermal expansion coefficients, mismatched thermal expansion may occur to the materials involved including copper, silicon, and silicon oxide. For example, copper has a higher thermal expansion coefficient than silicon. At high temperatures, the volume increase of the through-hole is not sufficient to accommodate thermal expansion of the TSV copper. Consequently, copper may be extruded from the TSV top surface, which affects yield and reliability of the thermal process and/or electrical properties of the resulting device.

As shown in FIG. 1, the TSV copper may be extruded from the through-hole 01 to form a copper protrusion 02. Due to existence of the copper protrusion 02, the metal layer 03 and the inter-layer dielectric layer 04 formed thereon have a non-flat surface, which generates device defects. When an interconnect structure is formed on surface of the TSV copper, the copper protrusions affect the electrical properties of this interconnect structure, and may cause a short circuit or open circuit. Further, even when the temperature is reduced to room temperature after formation of the TSV, copper shrinks and the copper extrusion still exists. This is because the copper lattice has been re-arranged during the thermal expansion, which cannot be recovered to its original form when cooling.

Thus, there is a need to overcome these and other problems of the prior art and to provide an IC device having a package structure and method for forming the IC device.

BRIEF SUMMARY OF THE DISCLOSURE

According to various embodiments, there is provided an integrated circuit (IC) device. The IC device can include a first metal interconnect structure disposed on a first substrate structure, and a second substrate structure disposed over the first substrate structure such that a through-hole in the second substrate structure is positioned over the first metal interconnect structure on the first substrate structure. The IC device can also include a second metal interconnect structure disposed on the second substrate structure, and an insulating layer disposed on sidewall of the through-hole in the second substrate structure. The IC device can further include a diffusion barrier layer disposed on the insulating layer, a portion of the first metal interconnect structure corresponding to the through-hole, a surface portion of the second substrate structure, and the second metal interconnect structure on the second substrate structure. The IC device can further include a metal interconnect layer disposed on the diffusion barrier layer and a total thickness of the insulating layer, the diffusion barrier layer, and the metal interconnect layer is less than a radius of the through-hole.

According to various embodiments, there is also provided a method of forming an IC device. In this method, a first substrate structure can be provided including a first metal interconnect structure disposed thereon. A first protective layer can be formed over the first substrate structure to expose the first metal interconnect structure. A second substrate structure can be provided over the first substrate structure to form a bonded structure. The second substrate structure can include a first surface having a second metal interconnect structure disposed thereon and a second protective layer can be formed over the second substrate structure to expose the second metal interconnect structure. A through-hole can be formed through the second substrate structure and positioned on the first metal interconnect structure on the first substrate structure. An insulating layer can be formed on sidewall of the through-hole in the second substrate structure. A diffusion barrier layer can be formed on each of the insulating layer, the exposed portion of the first metal interconnect structure, the exposed portion of the second metal interconnect structure, and a surface portion of the second protective layer. A metal interconnect layer can be formed on the diffusion barrier layer and a total thickness of the insulating layer, the diffusion barrier layer, and the metal interconnect layer can be less than a radius of the through-hole.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Various embodiments provide IC devices having a package structure and methods of forming the IC device. Generally, a through-silicon via (TSV) is known as a vertical electrical connection passing through a silicon wafer or die. As explained above, conventional TSVs include a copper pillar. As disclosed herein, a through-hole can be formed in a bonded structure and at least partially filled by one or more layers of material(s) to form an electrical interconnect between semiconductor devices in the bonded structure and thus to form a desired package structure. The material(s) filled in the through-hole do not include a copper pillar as known in the art.

In one embodiment, the through-hole can be filled with, e.g., an insulating layer, a diffusion barrier layer, and a metal interconnect layer, having a total thickness from the sidewall of the through-hole of less than or equal to the radius of the through-hole. In another embodiment, the through-hole can be filled to further include a protective layer over the metal interconnect layer, which has a total thickness from the sidewall of the through-hole of less than or equal to the radius of the through-hole.

The disclosed through-hole interconnect can effectively reduce the thermally induced stress at high temperatures (e.g., due to thermal expansion) and can thus reduce or avoid material extrusions from the through-hole. Process stability and electrical properties of the formed interconnect can be provided.

Figure 1:
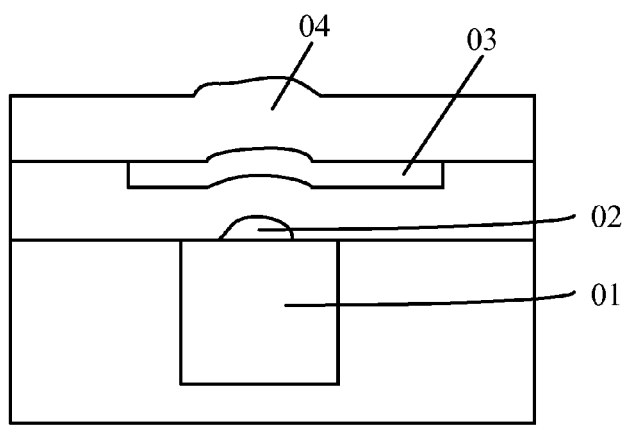
FIG. 1 is a schematic of a conventional package structure having a metal extrusion from a TSV surface.
Figure 2:
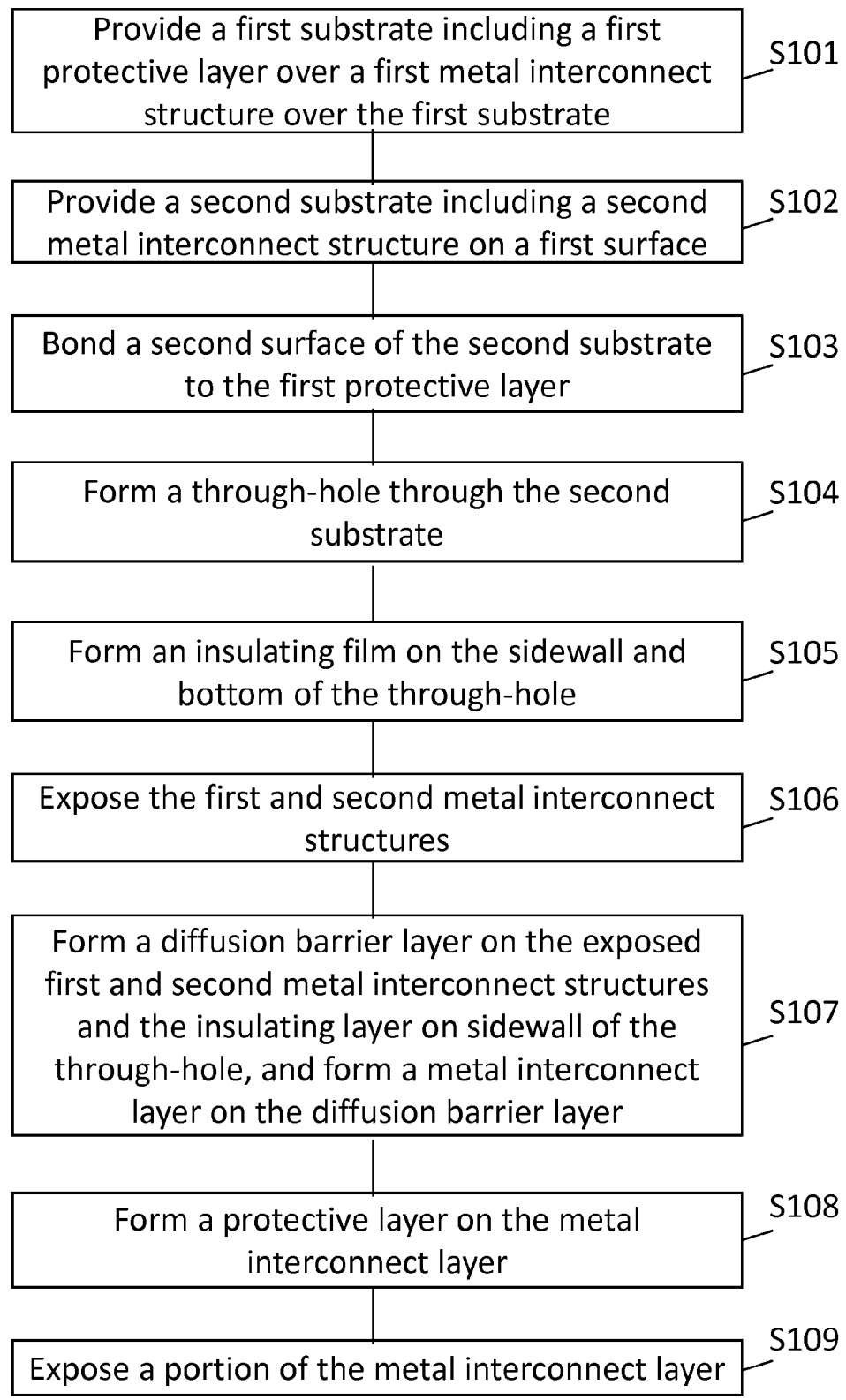
FIG. 2 depicts an exemplary method for forming an IC device having a package structure in accordance with various disclosed embodiments.
Figure 3:
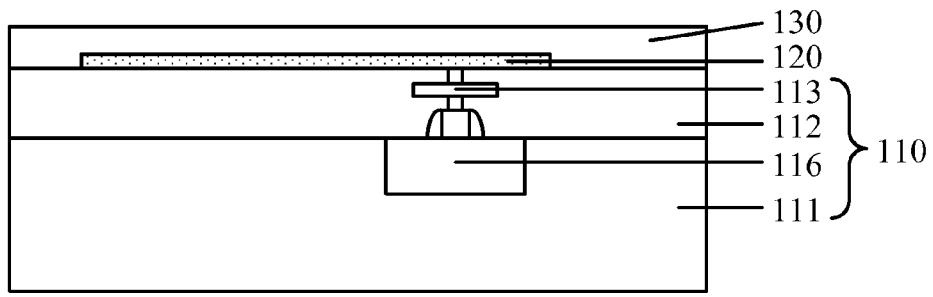
FIGS. 3-11 depict package structures at various stages of forming the IC device according to the method of FIG. 2 in accordance with various disclosed embodiments.
Figure 4:
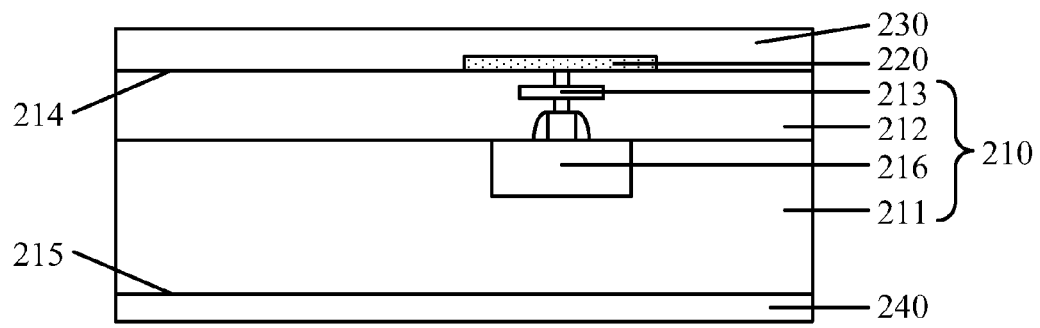

FIG. 2 depicts an exemplary method for forming an IC device including a package structure, and FIGS. 3-11 depict package structures at various stages of the device formation according to the method of FIG. 2 in accordance with various disclosed embodiments. In various embodiments, the package structure can include at least two substrate structures, e.g., a first substrate structure 110 as shown in FIG. 3 and a second substrate structure 210 as shown in FIG. 4, bonded to one another. Each substrate structure can include various components including, but not limited to, a semiconductor device (e.g., a MOS device), a semiconductor substrate (e.g., a Si substrate), an interconnect structure, and/or an inter-layer dielectric layer. The substrate structure can include, e.g., a wafer, an IC chip, or any suitable components.

At step S101 of FIG. 2 and referring to FIG. 3, a first substrate structure 110 can be provided. The first substrate structure 110 can include a first semiconductor device 116. A first metal interconnect structure 120 can be formed on the first substrate 110. The first metal interconnect structure 120 can be electrically connected to the first semiconductor device 116 through an interconnect structure 113. A first protective layer 130 can be formed on surface of the first metal interconnect structure 120. The first substrate 110 can also include a first semiconductor substrate 111 having the first semiconductor device 116 disposed therein. The first substrate 110 can further include a first inter-layer dielectric (ILD) layer 112 disposed over the first semiconductor substrate 111. The first ILD layer 112 can include the interconnect structure 113 disposed therein.

The first semiconductor substrate 111 can be, for example, a silicon substrate, a germanium substrate, a silicon-on-insulator (SOI) substrate, a glass substrate, and/or combinations thereof. In one embodiment, the semiconductor substrate 111 can be a silicon substrate.

The first semiconductor device 116 can include, but not be limited to, a MOS transistor, a diode, a memory, a capacitor, a resistor, an inductor, and/or combinations thereof, although a MOS transistor is shown in FIGS. 3 and 5-10 as an example of the first semiconductor device 116 for illustration purposes.

The first inter-layer dielectric layer 112 can be a single layer or a multi-layer having the interconnect structure 113 therein. The interconnect structure 113 can include metal layer(s) and/or conductive plug(s) (e.g., disposed between adjacent metal layers). The interconnect structure 113 can electrically connect the first semiconductor device 116 to the first metal interconnect structure 120.

The first metal interconnect structure 120 can include metal interconnect layer(s) and/or conductive plug(s). The first metal interconnect structure 120 can be made of one or more materials including, but not limited to, copper, aluminum, and/or tungsten. In one embodiment, the first metal interconnect structure 120 can be a metal interconnect layer electrically connected to the interconnect structure 113. The first metal interconnect structure 120 can be positioned corresponding to a position of the subsequently-formed through-hole in the first substrate structure such that a metal interconnect layer in the formed through-hole can be electrically connected to the first metal interconnection structure 120.

The first protective layer 130 can be made of a material including, but not limited to, silicon oxide, silicon nitride, and/or silicon nitrogen oxide, to protect the first metal interconnect structure 120 from external interferences. In one embodiment, the first protective layer 130 can be silicon oxide. The first protective layer 130 may be subsequently packaged with (e.g., bonded to) a surface of a second substrate structure, which may be made of a material including, for example, silicon oxide or silicon. The bonding can thus include a silicon oxide-silicon oxide bonding or a silicon oxide-silicon bonding. Other suitable bonding techniques can also be used.

At step S102 of FIG. 2 and referring to FIG. 4, a second substrate structure 210 can be provided to include a first surface 214 and a second surface 215. A second semiconductor device 216 can be disposed in the second substrate structure 210. On the first surface 214 of the second the substrate 210, a second metal interconnect structure 220 can be formed such that the second metal interconnect structure 220 is electrically connected to the second semiconductor device 216. A second protective layer 230 can be formed over the second metal interconnect structure 220 for protection. Optionally, a bonding layer 240 can be formed over the second surface 215 of the second substrate structure 210.

The second substrate structure 210 can include a second semiconductor substrate 211 having the second semiconductor device 216 located therein, a second inter-layer dielectric (ILD) layer 212 disposed over the second semiconductor device 216 and the second semiconductor substrate 211, and an interconnect structure 213 located in the second ILD layer 212. The second semiconductor substrate 211 can be, for example, a silicon substrate, a germanium substrate, a silicon-on-insulator (SOI) substrate, a glass substrate, and/or combinations thereof. In one embodiment, the semiconductor substrate 211 can be a silicon substrate. The second semiconductor device 216 can be any appropriate semiconductor device(s), such as, for example, MOS transistors, diodes, memories, capacitors, resistors, and/or inductors, although a MOS transistor is shown in FIGS. 4-10 for illustration purposes. The second inter-layer dielectric (ILD) layer 212 can include a single layer or a multi-layer. The interconnect structure 213 can thus be formed in the single layer or the multi-layer of the ILD layer 212. The interconnect structure 213 can include metal layer(s) and/or conductive plug(s) (e.g., disposed between adjacent metal layers). The interconnect structure 213 can electrically connect the second semiconductor device 216 to the second metal interconnect structure 220.

The second metal interconnect structure 220 can include metal interconnect layer(s) and/or conductive plug(s). The second metal interconnect structure 220 can be made of a material including, for example, copper, aluminum, and/or tungsten. In one embodiment, the second metal interconnect structure 220 can be a single layer of a metal interconnect layer. The second metal interconnect structure 220 can be electrically connected to the interconnect structure 213.

The second protective layer 230 can be made of a material including silicon oxide, silicon nitride, and/or silicon nitrogen oxide. The second protective layer 230 can protect the second metal interconnect structure 220 from external interferences. In one embodiment, the second protective layer 230 can be made of silicon oxide.

The bonding layer 240 formed over the second surface 215 of the second substrate structure 210 can be made of a material including, e.g., silicon oxide, and can be bonded to the first protective layer 130 of the first substrate structure 110. The bonding layer 240 can be formed after forming the second protective layer 230 or can be formed before forming the second semiconductor device 216 in the second substrate structure 210.

In various embodiments, the bonding layer can be made of a material determined by the bonding methods to be used. For example, when a polymer bonding process is used, the bonding layer may be made of a material including epoxy resin, polyimide (e.g., a polyimide dry film), benzocyclobutene (BCB) (e.g., a dry etching type BCB), etc. In one embodiment, the bonding layer can be a bonding oxide.

In other embodiments, the bonding layer can be formed on surface of the first protective layer 130 of the first substrate structure 110, instead of being formed on the second surface 215 of the second substrate structure 210. In still other embodiments, the bonding layer can be omitted and the second surface of the second substrate structure can be bonded to the first protective layer of the first substrate structure.

In various embodiments, the disclosed IC devices can have a package structure including more than two substrates. For example, a third substrate can be packaged to the first or the second substrate structure using the packaging method and interconnect as disclosed herein. In one embodiment, the third substrate can be bonded to the second protective layer on the first surface of the second substrate structure. The third substrate can include a through-hole positioned corresponding to the second metal interconnection structure of the second substrate structure such that a metal interconnect layer can be formed in the through-hole to be electrically connected to the second metal interconnect structure. The second protective layer can be made of silicon oxide and can be bonded to the third substrate by a bonding between silicon oxide and silicon oxide or between silicon oxide and silicon. Of course, any suitable bonding techniques can also be used.

In various embodiments, before forming the bonding layer, the second surface of the second substrate structure can be thinned by a process including, for example, grinding, polishing, chemical mechanical polishing (CMP), dry polishing, electrochemical etching, wet etching, plasma assisted chemical etching (PACE), atmospheric downstream plasma etching (ADPE), or combinations thereof. The etching depth and etching cost to form the through-hole can then be reduced.

Figure 5:
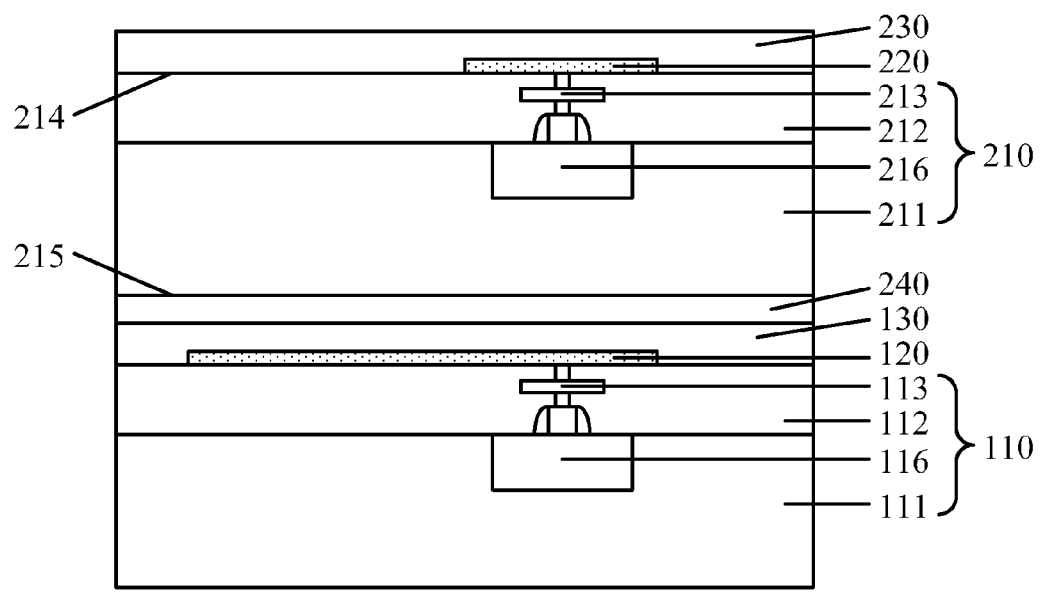

At step S103 of FIG. 2 and referring to FIG. 5, the bonding layer 240 on the second surface 215 of the second substrate structure 210 can be bonded to the first protective layer 130 of the first substrate structure 110. Various bonding processes can be used, including, but not limited to, a high temperature direct bonding process, a low temperature direct bonding process, an anodic bonding process, a glass solder bonding process, a laser bonding process, a polymer laminated bonding process, or combinations thereof. Among them, in one example, the low temperature direct bonding process can include a wet hydrophilic direct bonding, a plasma activation direct bonding, and/or a vacuum low temperature direct bonding. By using the low temperature direct bonding process, the first and second substrate structures can be bonded at low annealing temperatures, e.g., of about 300° C. or lower. In this manner, semiconductor devices having temperature-sensitive materials can be packaged at desired low temperatures. In another example, the plasma activation direct bonding process can include: polishing surfaces (e.g., surfaces of the bonding layer 240 of the second substrate structure and the first protective layer 130 of the first substrate structure) to be bonded; activating the polished surfaces by argon ions; joining the activated surfaces to pre-bond them; and annealing the pre-bonded surfaces, e.g., of the bonding layer 240 and the protective layer 130 at a low-temperature, e.g., from about 100° C. to about 300° C.

Figure 6:
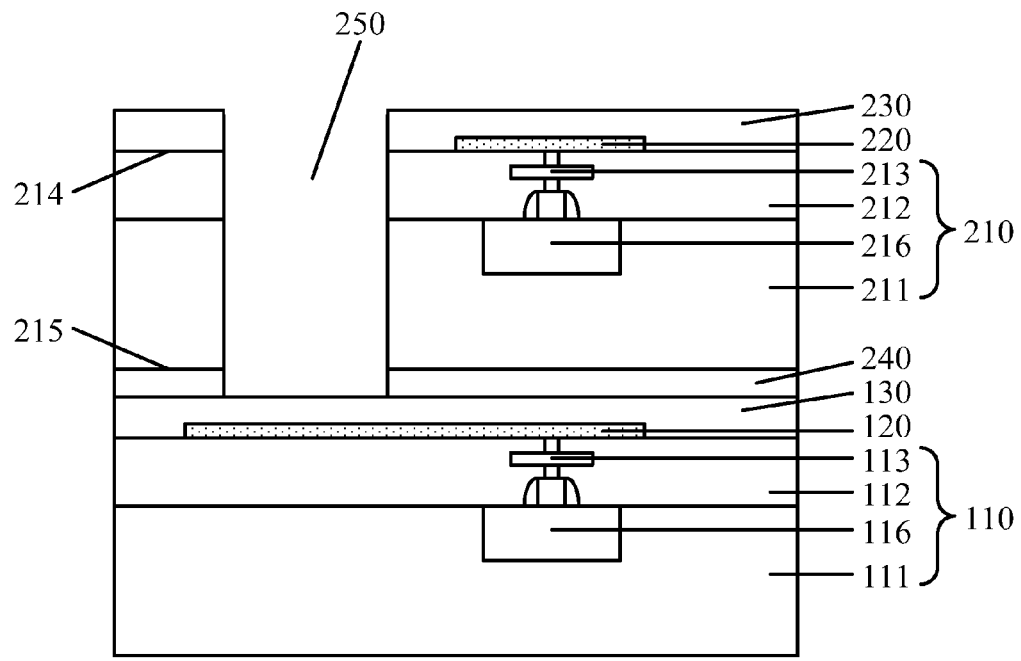

At step S104 of FIG. 2 and referring to FIG. 6, a through-hole 250 can be formed by etching the structure shown in FIG. 5 to remove a portion of each of the second protective layer 230, the second substrate structure 210, and the bonding layer 240 until the first protective layer 130 is exposed. In one embodiment, the through-hole 250 can be formed by DRIE. The through-hole 250 can be formed to have a diameter ranging from about 5 μm to about 15 μm.

In other embodiments, the through-hole 250 can be formed by, for example, a Bosch process. This process can include an etching step, e.g., by a plasma etching, to remove a portion of the second substrate structure and the second protective layer to form a through-hole; and a polymerizing step to form polymers on the sidewall of the etched through-hole. The etching step and the polymerizing step can be alternated until a desired through-hole is formed. In certain embodiments, the formed through-hole can have high aspect ratio. In still other embodiments, the through-hole can be directly formed through the second substrate structure and the bonding layer to expose the first protective layer at the bottom of the formed through-hole.

Figure 7:
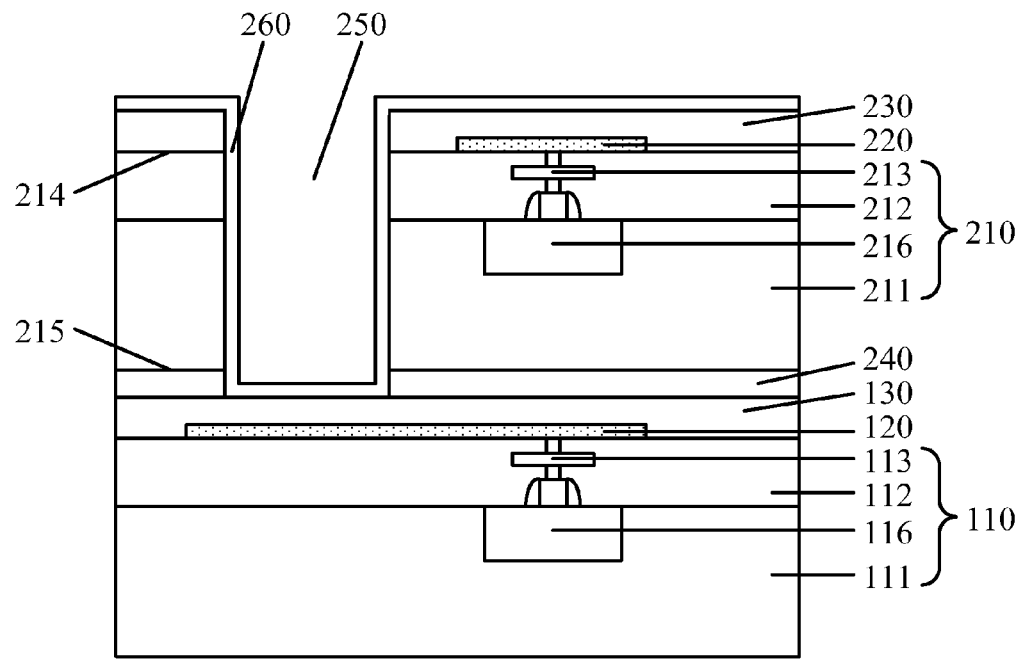

At step S105 of FIG. 2 and referring to FIG. 7, an insulating film 260 can be formed on the entire surface of the structure shown in FIG. 6. That is, the insulating film 260 can be formed on the sidewall and bottom surfaces of the through-hole 250 and the surface of the second protective layer 230.

In one embodiment, the insulating film 260 can be made of silicon oxide. The insulating film 260 can be formed by a process including, e.g., a plasma-enhanced chemical vapor deposition, a low pressure chemical vapor deposition, a high density plasma chemical vapor deposition, and/or combinations thereof. Using such deposition process(es), material(s)

can be deposited on surfaces in steps. The insulating layers may be formed in through-holes with large aspect ratio.

Figure 8:
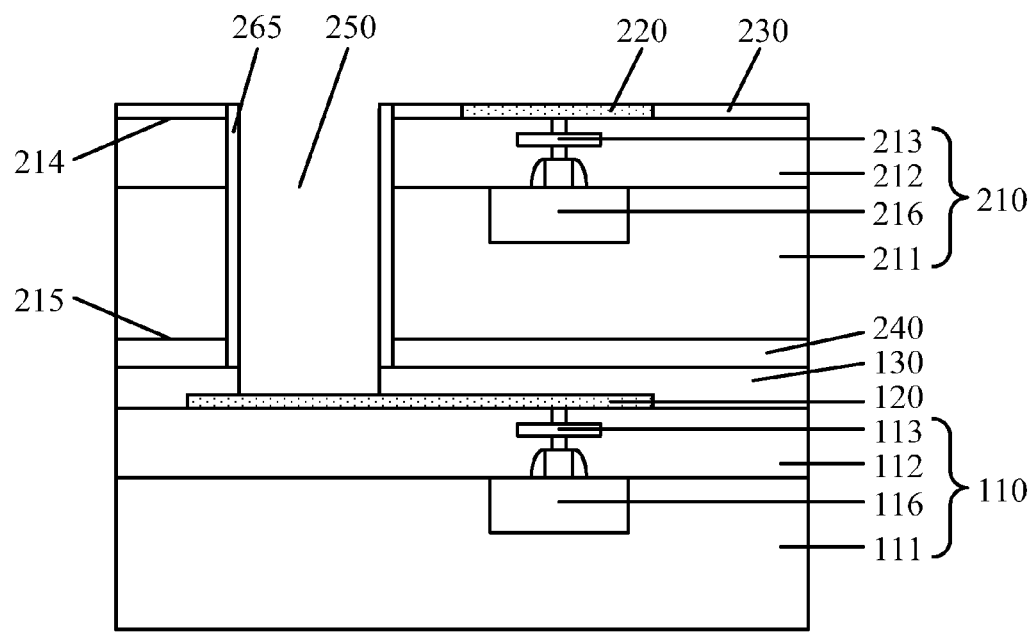

At step S106 of FIG. 2 and referring to FIG. 8, a portion of the insulating film 260 and a portion of the underlying first protective layer 130 associated with the bottom of the though-hole can be removed to expose the first metal interconnect structure 120. In addition, a portion of the insulating film 260 on the second protective layer 230 can be removed and a portion of the second protective layer 230 can also be removed to at least expose a surface portion of the second metal interconnect structure 220. The insulating film 260 can thus be partially removed by a suitable etching process to leave an insulating layer 265 on the sidewall of the through-hole 250. The insulating layer 265 can be used to electrically isolate the second substrate structure 210 from the subsequent-formed metal interconnect layer.

After the insulating layer 265 is formed on the sidewall of the through-hole, a portion of the first protective layer 130 at the bottom of the through-hole 250 can be removed until the first metal interconnect structure 120 is exposed and ready to be electrically connected to a subsequently-formed metal interconnect layer in the through-hole.

In some embodiments, the first protective layer 130 and the second protective layer 230 can have similar or same thickness. When the first protective layer 130 is etched to expose the first metal interconnect structure 120 in the through-hole 250, the second protective layer 230 can be etched to expose the second metal interconnect structure 220 as shown in FIG. 8. The portions of the first protective layer 130 and the second protective layer 230 can be removed in the same process. The exposed second metal interconnect structure 220 can be electrically connected to a subsequently-formed metal interconnect layer.

In other embodiments, when the first protective layer 130 and the second protective layer 230 have different thicknesses, separate etching processes can be carried out to etch the first protective layer 130 to expose the first metal interconnect structure 120 in the through-hole 250 and to etch the second protective layer 230 to expose the second metal interconnect structure 220. The second protective layer 230 can further be polished by, e.g., a chemical mechanical polishing process, an etching process, or their combination(s), to form the structure as shown in FIG. 8.

Figure 9:
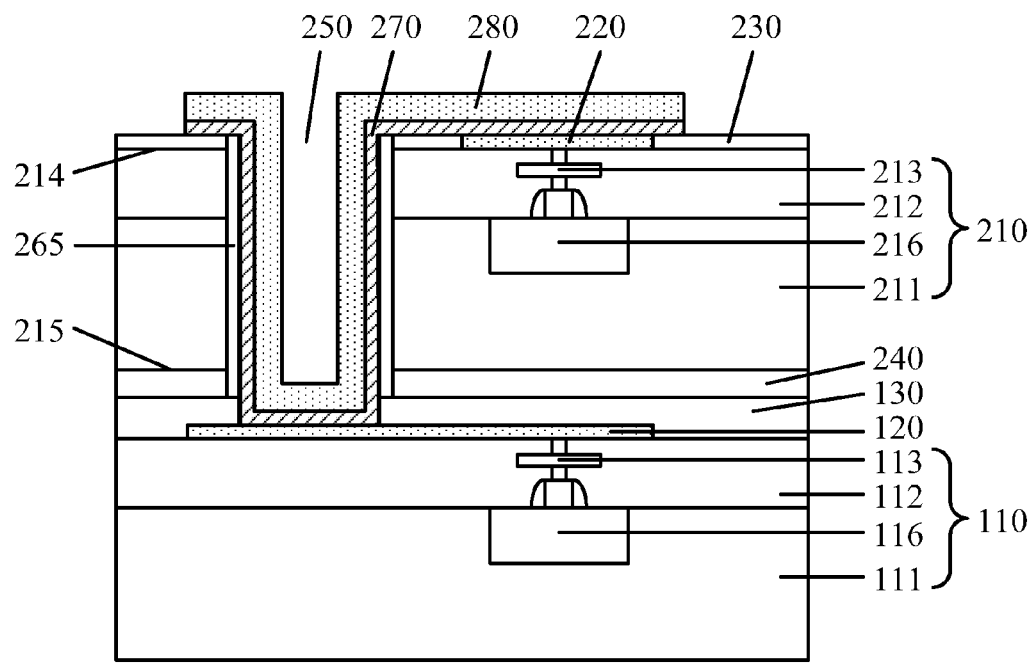

At step S107 of FIG. 2 and referring to FIG. 9, a diffusion barrier layer 270 can be formed on the exposed surfaces in the through-hole 250 (e.g., including the bottom surface formed by the exposed first metal interconnect layer 120 and a sidewall surface formed by the insulating layer 265 and a portion of the first protective layer 130), a surface portion of the second protective layer 230, and the exposed second metal interconnect structure 220. A metal interconnect layer 280 can then be formed over the diffusion barrier layer 270.

The diffusion barrier layer 270 can be made of a material including titanium, tantalum, titanium nitride, tantalum nitride, titanium tungsten, or any combination(s) thereof. The diffusion barrier layer 270 can prevent metal diffusion from the metal interconnect layer 280 to the second substrate structure 210. After forming the diffusion barrier layer 270, the metal interconnect layer 280 can be formed on the diffusion barrier layer 270. The metal interconnect layer 280 can be made of a material including tungsten, aluminum, etc. The diffusion barrier layer 270 and/or the metal interconnect layer 280 can be formed by a process including sputtering, plasma physical vapor deposition, high density plasma chemical vapor deposition, low pressure chemical vapor deposition, atomic layer deposition, or the like. In various embodiments, the plasma physical vapor deposition, the high density plasma chemical vapor deposition, the low pressure chemical vapor deposition, and the atomic layer deposition process can provide desired step coverage such that the formation of the diffusion barrier layer 270 and the metal interconnect layer 280 do not fill up the through-hole 250. That is, the through-hole 250 is partially filled.

In some embodiments, the diffusion barrier layer 270 and the metal interconnect layer 280 can be formed in the same process. Such process can include, for example, forming a corresponding diffusion barrier film (not shown) on the entire surface of the device shown in FIG. 8, (i.e., on the exposed first metal interconnect layer 120, the insulating layer 265, the exposed first protective layer 130 in the through-hole 250, the second protective layer 230, and the exposed second metal interconnect structure 220) using, for example, a high density plasma chemical vapor deposition process. This can be followed by forming a metal interconnect film (not shown) corresponding to the metal interconnect layer 280 on the formed diffusion barrier film (not shown). Standard photolithographic process can then be used. For example, a patterned photoresist layer can be formed on the metal interconnect film and used as a mask for an etching process to remove portions of the diffusion barrier film (not shown) and metal interconnect film (not shown) to form the diffusion barrier layer 270 and the metal interconnect layer 280 as shown in FIG. 9. The metal interconnect layer 280, the diffusion barrier layer 270, and the insulating layer 265 can have a total thickness of less than (or sometimes equal to) the radius of the through-hole 250. In this manner, because the metal interconnect layer 280 can be connected to the first metal interconnect structure 120 and to the second metal interconnect structure 220 via the diffusion barrier layer 270, the first semiconductor device 116 in the first substrate structure 110 can be electrically connected to the second semiconductor device 216 in the second substrate structure 210.

In other embodiments, after forming the insulating film 260 as shown in FIG. 7, a diffusion barrier film can be formed on this insulating film. The diffusion barrier film, the insulating film, and a portion of the second protective layer can be etched to expose the first metal interconnect structure at the bottom of the through-hole and to expose a portion of the second metal interconnect structure. On the sidewall of the through-hole, a diffusion barrier layer corresponding to the diffusion barrier film can then be formed on the insulating layer. A metal interconnect film, corresponding to the metal interconnection structure 280, can be formed on the entire surface of the structure to cover the first metal interconnect structure at the bottom of the through-hole, the diffusion barrier layer on the sidewall of the through-hole, the exposed second metal interconnect structure, and the second protective layer. The metal interconnect film can then be etched to form a metal interconnection layer to cover the first metal interconnect structure at the bottom of the through-hole, the diffusion barrier layer on the sidewall of the through-hole, the exposed second metal interconnect structure, and a portion of the second protective layer. In this case, the formed metal interconnection layer can be directly (as opposed to via the diffusion barrier layer 270 in FIG. 9) connected to the first metal interconnect structure and the second metal interconnect structure. The metal interconnect structures can have lower resistance than the diffusion barrier layer. The reduced electrical resistance can reduce energy loss in the conductive circuit, while the diffusion barrier layer disposed over the sidewall of the through-hole can still be able to prevent the metal diffusion from the metal interconnect layer to the second substrate structure.

Figure 10:
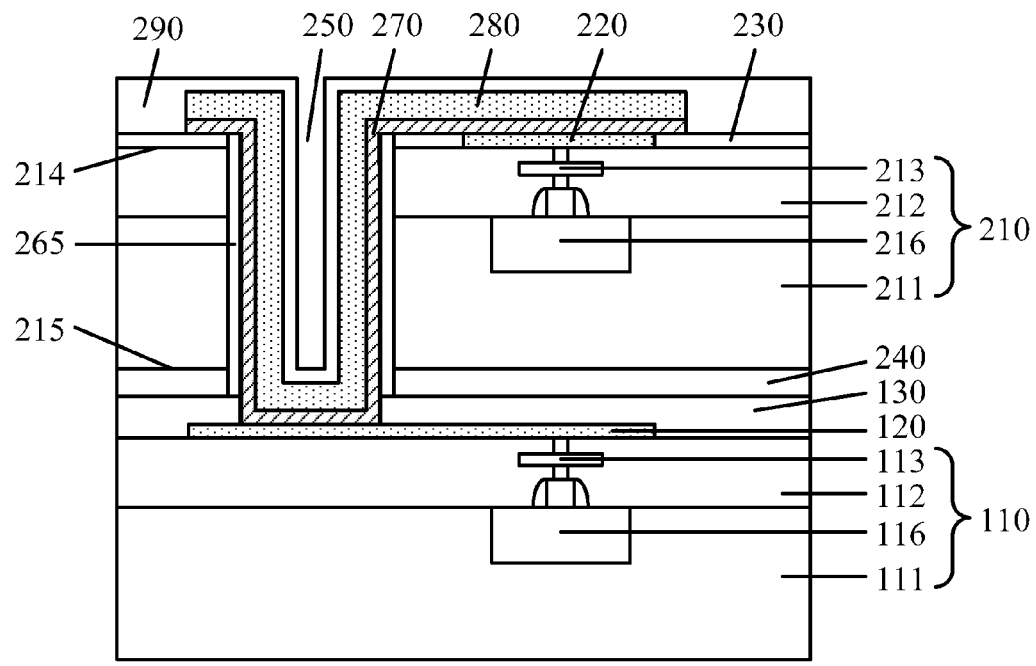

At step S108 of FIG. 2 and refer to FIG. 10, a third protective layer 290 can be formed on surface of the metal interconnect layer 280 and the exposed second protective layer 230. The third protective layer 290 can be made of a material including, but not limited to, silicon oxide, silicon nitride, and/or silicon oxynitride. In one embodiment, the third protective layer 290 can be a passivation layer. In the through-hole 250, the third protective layer 290, the metal interconnect layer 280, the diffusion barrier layer 270, and the insulating layer 265 can have a total thickness from sidewall of the through-hole of less than (or sometimes equal to) the radius of the through-hole 250, i.e., the through-hole 250 is partially filled. In one embodiment, the total thickness of the third protective layer 290, the metal interconnect layer 280, the diffusion barrier layer 270, and the insulating layer 265 can be less than 1 µm. In other words, the third protective layer 290, the metal interconnect layer 280, the diffusion barrier layer 270, and the insulating layer 265 do not fill up the through-hole 250 and may leave an opening or some kind of space therein to accommodate volume change of materials due to thermal expansion. In the case that the metal interconnect layer 280 is thermally expanded, the metal interconnect layer 280 and/or the third protective layer 290 are configured in a way such that they will not be extruded from the through-hole. Thus, metal material extrusions can be avoided.

In other embodiments, the third protective layer covering the metal interconnect layer may fill the entire through-hole to form a surface having a desired flatness, which can facilitate formation of another interconnect structure and another semiconductor device, or facilitate a bonding to another substrate over the flat surface of the third protective layer. That is, the partially filled through-hole 250 may be filled by the third protective layer. Because the metal interconnect layer in the partially-filed through-hole has much less metal volume than a copper pillar filled in the entire through-hole, the disclosed metal interconnect layer in the through-hole is less likely to be deformed to form material extrusions due to thermal expansion.

Optionally, the disclosed metal interconnect layer in the through-hole can be made of a material including, e.g., tungsten, or other metals that have low thermal expansion coefficients, e.g., lower than copper, to further avoid metal extrusions.

Figure 11:
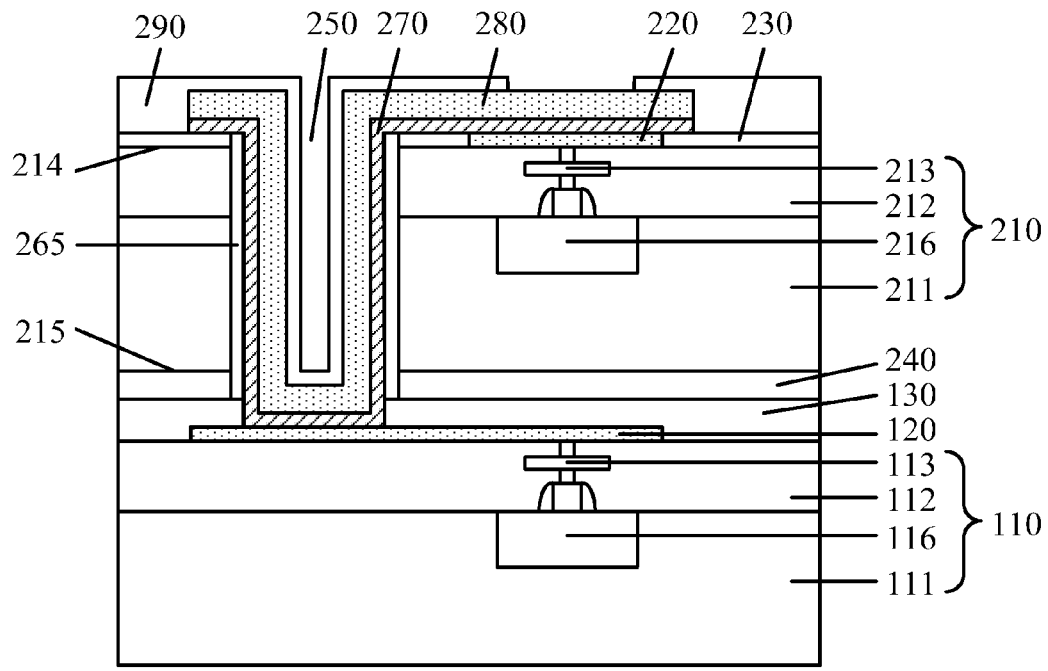

At step S109 of FIG. 2 and referring to FIG. 11, the third protective layer 290 can be etched to expose a surface portion of the second metal interconnect layer 280. The exposed metal interconnect layer 280 can be used as a contact point with an external circuit or a printed circuit board.

In other embodiments, when more substrates, e.g., a third substrate, is included in the package structure, the third protective layer on the second substrate structure can be bonded or packaged with the third substrate and the etching process of the third protective layer as depicted in FIG. 11 can be omitted.

Figure 12:
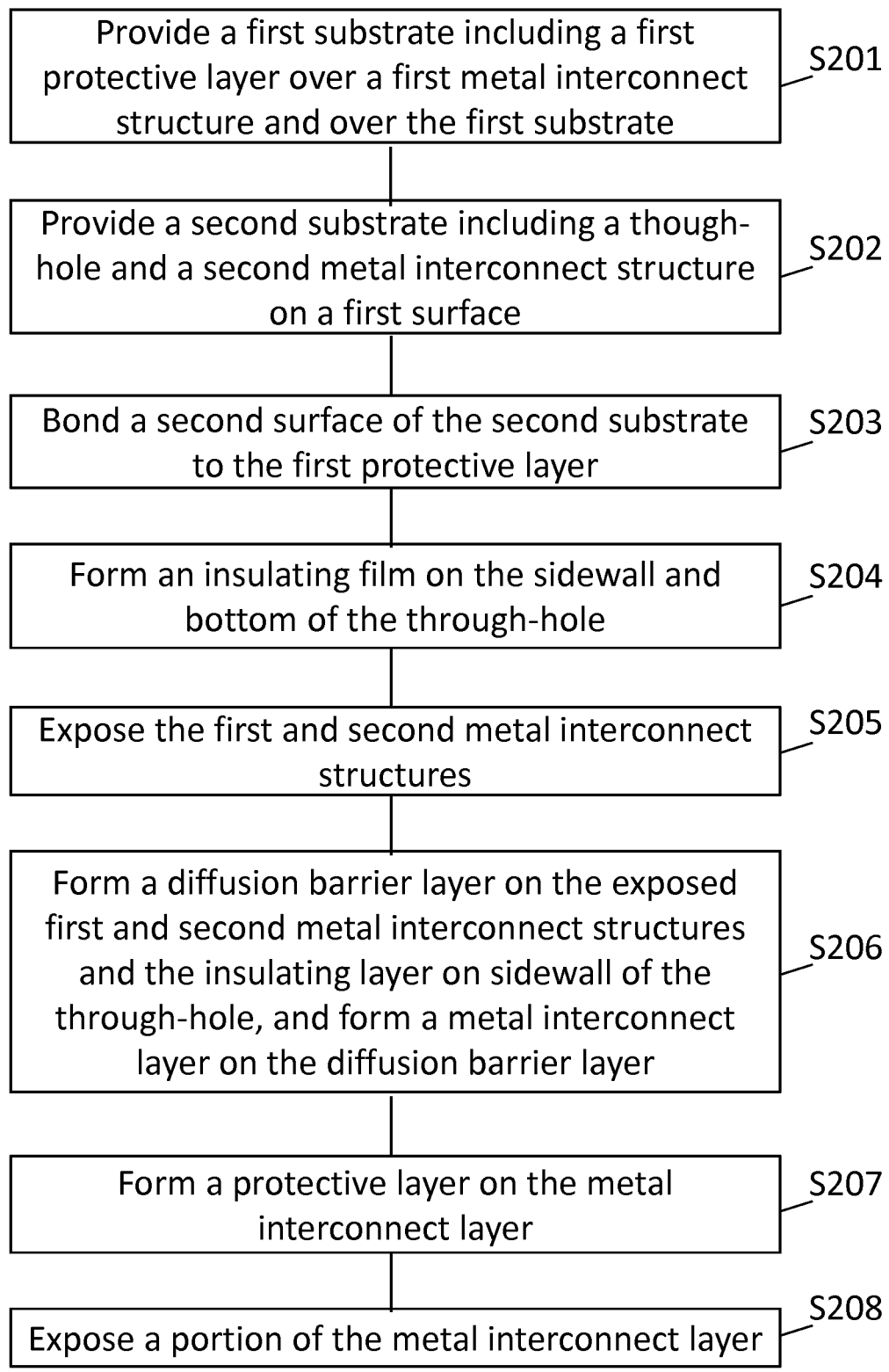
FIG. 12 depicts another exemplary method for forming an IC device having a package structure in accordance with various disclosed embodiments.

FIG. 12 illustrates another exemplary method of forming an IC device having a package structure. Similar structures to the above-disclosed embodiments may be used and, thus, are omitted when describing the process as depicted in FIG. 12.

At step S201 of FIG. 12, a first substrate structure can be provided to include a first semiconductor device. A first metal interconnect structure can be formed on the first substrate structure. The first metal interconnect structure can be electrically connected to the first semiconductor device. A first protective layer can be formed on the first metal interconnect structure.

At step S202 of FIG. 12, a second substrate structure can be provided to include a first surface and a second surface. The second substrate structure can include a second semiconductor device disposed therein. A second metal interconnection structure can be formed on the first surface of the second substrate structure. The second metal interconnect structure can be electrically connected to the second semiconductor device. A second protective layer can be formed on the second metal interconnect. A bonding layer can be formed on the second surface of the second substrate structure. Prior to bonding the first and the second substrate structures, a through-hole can be formed through each of the second substrate structure, the second protective layer, and/or the bonding layer.

At step S203 of FIG. 12, the bonding layer on the second surface of the second substrate structure can be packaged with (e.g., bonded to) the first protective layer of the first substrate structure.

At step S204 of FIG. 12, an insulating film can be formed on the bottom and sidewall of the through-hole, and on the second protective layer of the second substrate structure.

At step S205 of FIG. 12, a portion of the insulating film and a portion of the first protective layer associated with the bottom of the through-hole can be etched and removed to expose at least a portion of the first metal interconnect structure. In addition, a portion of the insulating film on the second protective layer and on the second metal interconnect structure can be removed. The second metal interconnect structure can be exposed.

At step S206 of FIG. 12, a diffusion barrier layer can be formed on the exposed surface of the first metal interconnect layer, the etched insulating film, the exposed portion of the second protective layer and the second metal interconnect structure. A metal interconnect layer can then be formed on the diffusion barrier layer.

At step S207 of FIG. 12, a third protective layer can be formed on the metal interconnect layer and the exposed surface of the second protective layer.

At step S208 of FIG. 12, the third protective layer can be etched to expose the second metal interconnect structure.

In this manner, prior to the bonding of the first and the second substrate structures, a through-hole can be formed through each of the second substrate structure, the second protective layer, and the bonding layer. Such through-hole can be formed, for example, when forming the semiconductor die (e.g., the die of the second substrate structure without any semiconductor devices yet being formed therein), or after forming the second protective layer, or after forming the bonding layer.

In one embodiment, after formation of the through-hole in the semiconductor die, one or more semiconductor devices can then be formed in the semiconductor die. As such, the semiconductor devices cannot be affected by the formation process of the through-hole. In another embodiment, the through-hole can be formed after forming the second protective layer and before forming the bonding layer. For example, the through-hole can be formed by first etching (e.g., deep reactive ion etching (DRIE)) the second protective layer and the second substrate structure to form a through-hole, which may or may not be through the entire thickness of the second substrate structure. The second substrate structure can be further processed, e.g., thinned, at the second surface until the through-hole is through the entire thickness of the second substrate structure. After forming the through-hole, a bonding layer can be formed on the second surface of the second substrate structure and can be bonded to the first protective layer on the first substrate structure, where the through-hole can be positioned or aligned with at least a portion of the first metal interconnect structure.

According to the method depicted in FIG. 12 and referring to FIG. 10, the package structure disclosed herein can thus include, for example, a first substrate structure 110 including a first semiconductor substrate 111, a first semiconductor device 116 located in the first semiconductor substrate 111, a first inter-layer dielectric layer 112 covering the first semiconductor device 116 and the first semiconductor substrate 111, an interconnect structure 113 in the first inter-layer dielectric layer 112, a first metal interconnect structure 120 on surface of the first inter-layer dielectric layer 112 of the first substrate structure 110, and a first protective layer 130 on the first inter-layer dielectric layer 112 to expose at least a portion of the first metal interconnect structure 120. The first metal interconnect structure 120 on the first substrate structure 110 can be electrically connected to the first semiconductor device 116 in first substrate structure 110 through the interconnect structure 113.

Still referring to FIG. 10, the exemplary package structure can also include a second substrate structure 210. The second substrate structure 210 can include a first surface 214 and second surface 215 and a second semiconductor substrate 211. A second semiconductor device 216 can be located in the second semiconductor substrate 211. A second inter-layer dielectric layer 212 can be formed to cover the second semiconductor device 216 and the second semiconductor substrate 211. An interconnect structure 213 can be located in the second inter-layer dielectric layer 212. A bonding layer 240 can be disposed on the second surface 215 of the second substrate structure 210. The bonding layer 240 can be bonded to the first protective layer 130 of the first substrate structure 110. A second metal interconnect structure 220 can be disposed on the first surface 214 of the second substrate structure 210. A second protective layer 230 can be formed on the first surface 214 of the second substrate structure 210 to expose at least a portion of the second metal interconnect structure 220. The interconnect structure 213 can electrically connect the second semiconductor device 216 to the second metal interconnect structure 220.

The exemplary package structure can further include a through-hole 250 formed through each of the first protective layer 130, the bonding layer 240, the second substrate structure 210, and the second protective layer 230. The through-hole 250 can be positioned corresponding to the exposed first metal interconnect layer 120. An insulating layer 265 can be formed on sidewall of the through-hole 250. A diffusion barrier layer 270 can be formed on the exposed first metal interconnect layer 120, the insulating layer 265, a portion of the second protective layer 230, and the exposed second metal interconnect structure 220. A metal interconnect layer 280 can then be formed on the surface of the diffusion barrier layer 270. Covering the surface of the metal interconnect layer 280 can be a third protective layer 290. The metal interconnect layer 280 can be electrically connected to the second metal interconnect structure 220. The insulating layer 265, the diffusion barrier layer 270, the metal interconnect layer 280, and the third protective layer 290 can have a total thickness of less than the radius of the through-hole 250. In other words, the through-hole 250 is not completely filled by all these materials and can have an opening with enough tolerance of volume change of the metal interconnect layer due to thermal expansion. Materials, e.g., of the metal interconnect layer and/or the third protective layer, are not extruded from the opening of the through-hole.

In other embodiments, the opening of the through-hole can be filled with the third protective layer. The surface flatness of the third protective layer and the characteristics of the metal interconnect layer (e.g., having less volume change of thermal expansion as compared with a metal pillar filled within the entire through-hole) can facilitate subsequent formation of interconnect structure(s) and semiconductor device(s) and/or the bonding of another substrate with the third protective layer. Material extrusions from the through-hole can be avoided.

Other applications, advantages, alternations, modifications, or equivalents to the disclosed embodiments are obvious to those skilled in the art.

What is claimed is:

1. An integrated circuit (IC) device comprising:
   a first substrate structure;
   a first metal interconnect structure disposed on the first substrate structure;
   a second substrate structure disposed over the first substrate structure, the second substrate structure including a through-hole disposed there-through and positioned over the first metal interconnect structure on the first substrate structure;
   a second metal interconnect structure disposed on the second substrate structure;
   an insulating layer disposed on sidewall of the through-hole in the second substrate structure;
   a diffusion barrier layer disposed on the insulating layer, a portion of the first metal interconnect structure corresponding to the through-hole, a surface portion of the second substrate structure, and the second metal interconnect structure on the second substrate structure; and
   a metal interconnect layer disposed on the diffusion barrier layer, wherein a total thickness of the insulating layer, the diffusion barrier layer, and the metal interconnect layer is less than a radius of the through-hole.

2. The device of claim 1, further including a protective layer disposed on the metal interconnect layer, wherein the insulating layer, the diffusion barrier layer, the metal interconnect layer, and the protective layer have a total thickness of less than or equal to the radius of the through-hole.

3. The device of claim 2, wherein the total thickness is less than about 1 μm.

4. The device of claim 1, wherein the metal interconnect layer is made of a material including tungsten or aluminum.

5. The device of claim 1, wherein the first substrate structure includes a first semiconductor device electrically connected to the first metal interconnect structure, and the second substrate structure includes a second semiconductor device electrically connected to the second metal interconnect structure.

6. The device of claim 5, wherein one or both of the first semiconductor device and the second semiconductor device include a MOS transistor, a diode, a memory, a resistor, a capacitor, an inductor, or a combination thereof.

7. The device of claim 1, wherein the through-hole has a diameter ranging from about 5 μm to about 15 μm.

8. The device of claim 1, further including a bonding layer configured to bond the first substrate structure and the second substrate structure.

9. The device of claim 8, wherein the bonding layer is made of a material including silicon oxide, polyimide, epoxy resin, benzocyclobutene, or a combination thereof.

10. The device of claim 1, wherein a portion of the metal interconnect layer is exposed by the protective layer for an electrical connection.

11. A method of forming an integrated circuit (IC) device comprising:
    providing a first substrate structure including a first metal interconnect structure disposed thereon;

forming a first protective layer over the first substrate structure to expose the first metal interconnect structure;

providing a second substrate structure over the first substrate structure to form a bonded structure, wherein the second substrate structure includes a first surface having a second metal interconnect structure disposed thereon;

forming a second protective layer over the second substrate structure to expose the second metal interconnect structure;

forming a through-hole through the second substrate structure and positioned on the first metal interconnect structure on the first substrate structure;

forming an insulating layer on sidewall of the through-hole in the second substrate structure;

forming a diffusion barrier layer on each of the insulating layer, the exposed portion of the first metal interconnect structure, the exposed portion of the second metal interconnect structure, and a surface portion of the second protective layer; and forming a metal interconnect layer on the diffusion barrier layer, wherein a total thickness of the insulating layer, the diffusion barrier layer, and the metal interconnect layer is less than a radius of the through-hole.

12. The method of claim 11, further including forming a third protective layer on the metal interconnect layer, wherein the insulating layer, the diffusion barrier layer, the metal interconnect layer, and the third protective layer have a total thickness of less than or equal to the radius of the through-hole.

13. The method of claim 11, wherein the through-hole is formed prior to forming the bonded structure by binding a second surface of the second substrate structure to the first protective layer of the first substrate structure.

14. The method of claim 11, wherein the through-hole is formed after forming the bonded structure by binding a second surface of the second substrate structure to the first protective layer of the first substrate structure, wherein the formation of the through-hole includes removing a portion of the first protective layer to expose the first metal interconnect structure.

15. The method of claim 11, wherein a bonding layer is provided on a second surface of the second substrate structure to bind the second substrate structure to the first protective layer of the first substrate structure.

16. The method of claim 11, wherein the through-hole is formed in a semiconductor die for forming the second substrate structure, or after forming the second protective layer on the first surface of the second substrate structure, or after forming a bonding layer on a second surface of the second substrate structure.

17. The method of claim 11, wherein the bonded structure is formed by a process including a high temperature direct bonding process, a low temperature direct bonding process, an anodic bonding process, a glass solder bonding process, or a combination thereof.

18. The method of claim 11, wherein the through-hole is formed by a deep reactive ion etching (DRIE) process or a Bosch process.

19. The method of claim 11, wherein the metal interconnect layer is formed on the diffusion barrier layer by a process including a sputtering deposition, a plasma physical vapor deposition, a high density plasma chemical vapor deposition, a low pressure chemical vapor deposition, an atomic layer deposition, or a combination thereof.

20. The method of claim 11, wherein the first substrate structure includes a first semiconductor device electrically connected to the first metal interconnect structure, and the second substrate structure includes a second semiconductor device electrically connected to the second metal interconnect structure.

* * * * *